United States Patent [19]
Cochran et al.

[11] Patent Number: 5,963,054
[45] Date of Patent: Oct. 5, 1999

[54] HIGH VOLTAGE CMOS LOGIC CIRCUIT USING LOW VOLTAGE TRANSISTORS

[75] Inventors: William Thomas Cochran, Clermont, Fla.; Scott Wayne McLellan, Albany Township, Berks County, Pa.

[73] Assignee: Lucent Technologies Inc., Murray Hill, N.J.

[21] Appl. No.: 08/985,709

[22] Filed: Dec. 5, 1997

[51] Int. Cl.$^6$ ............... H03K 19/0175; H03K 19/094
[52] U.S. Cl. .................. 326/68; 326/81; 326/83
[58] Field of Search ................... 326/68, 80, 81, 326/83, 121, 86

[56] References Cited

U.S. PATENT DOCUMENTS

| | | | |
|---|---|---|---|
| 5,465,054 | 11/1995 | Erhart | 326/81 |
| 5,539,334 | 7/1996 | Clapp, III et al. | 326/68 |
| 5,604,449 | 2/1997 | Erhart et al. | 326/81 |
| 5,821,800 | 10/1998 | Le et al. | 326/68 |

FOREIGN PATENT DOCUMENTS

| | | | |
|---|---|---|---|
| 362243422 | 10/1987 | Japan | 326/121 |

*Primary Examiner*—Michael Tokar
*Assistant Examiner*—Daniel D. Chang
*Attorney, Agent, or Firm*—Allen, Dyer, Doppelt, Milbrath & Gilchrist, P.A.

[57] ABSTRACT

A logic gate arrangement for switching voltages greater than the gate breakdown voltage of the transistors in the gate. Two transistors of different conductivity types, are disposed between the N and P transistors which perform the logic function of a conventional CMOS gate. The gates of the two transistors are connected to a first voltage that is less than the breakdown voltage of the transistors, with the entire logic gate being supplied with a voltage that is greater than the first voltage. Three outputs are provided, two with limited voltage swings that drive other like gates or conventional CMOS gates and the other output having a full voltage swing. Logic gates implementing various logic functions, such as NAND and NOR, are disclosed. Further, a cross-coupled logic gate is disclosed which can operate as a latch or as a logic voltage translator circuit.

20 Claims, 3 Drawing Sheets

5,963,054

HIGH VOLTAGE CMOS LOGIC CIRCUIT USING LOW VOLTAGE TRANSISTORS

DESCRIPTION OF THE PRIOR ART

Integrated circuit logic gates generally have a maximum power supply voltage(s) and logic signal voltage levels limited by the "wear out" of the transistors in the gate. For example, in newer high-speed integrated circuits with fine line widths and thin gate oxides, the transistors therein cannot withstand more than seven volts or so across the gate oxide of the transistors without substantially increasing the time-dependent breakdown of the gate oxide. Thus, using these transistors to make complementary metal-oxide-semiconductor (CMOS) logic circuits having the highest logic signal voltage level approximately that of the power supply voltage, the power supply voltage must be seven volts or less, typically specified as five volts or less.

In certain applications it may be desirable to switch larger voltages that the individual transistors can withstand. For example, programming flash memories, a form of electrically programmable read-only memories, requires the memory cells to be selectively subjected to a significantly higher voltage (e.g., ten volts for a typical flash memory) than the "normal" power supply voltage (e.g., five volts) or that the conventional logic transistors can withstand.

To address this problem, the gate oxides of all the transistors on the chip could be thickened to withstand the higher voltages but the transistors may no longer work well at the lower, "normal", logic voltage levels. Alternatively, on-chip logic circuitry may be duplicated using high voltage transistors where switching higher voltages is necessary but at a cost of a more complex manufacturing process and increased chip size.

Therefore, it is desirable to provide a logic gate design that can switch power supply voltages higher than the gate breakdown voltage of the transistors comprising the gate. Further, the logic gate should still be operable at the lower, "normal", power supply voltage. Still further, it is desirable that this ability be provided without significantly changing the operating characteristics of the transistors (e.g., the breakdown and threshold voltages).

SUMMARY OF THE INVENTION

This and other aspects of the invention may be obtained generally in an integrated circuit logic gate, the logic gate having at least one first transistor, second and third transistors, and at least one fourth transistor. The first transistor is of a first conductivity type and has the outputs thereof coupling between a first power supply terminal and a first node. The second transistor is of the first conductivity type and has the outputs coupling between the first node and a second node, and the input thereof coupling to a second power supply terminal. The third transistor is of a second conductivity type and has the outputs thereof coupling between the second node and a third node, the input thereof coupling to the second supply terminal. The fourth transistor is of the second conductivity type and has the outputs thereof coupling between a third node and a third power supply terminal. The first and fourth transistors provide in combination the desired logic function. The voltage of the second power supply terminal is between that of the first and third power supply terminal. Typically, the third power supply terminal is at ground or zero volts while the second power supply terminal has a voltage of less than the gate breakdown voltage of the transistors. The first power supply terminal can then be connected to a voltage greater than the gate breakdown voltage, such that the voltage swing on the second node is substantially from ground to the first power supply terminal voltage.

Additionally, two of the above circuits can be cross-coupled to operate as a latch or a logic voltage translator circuit.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
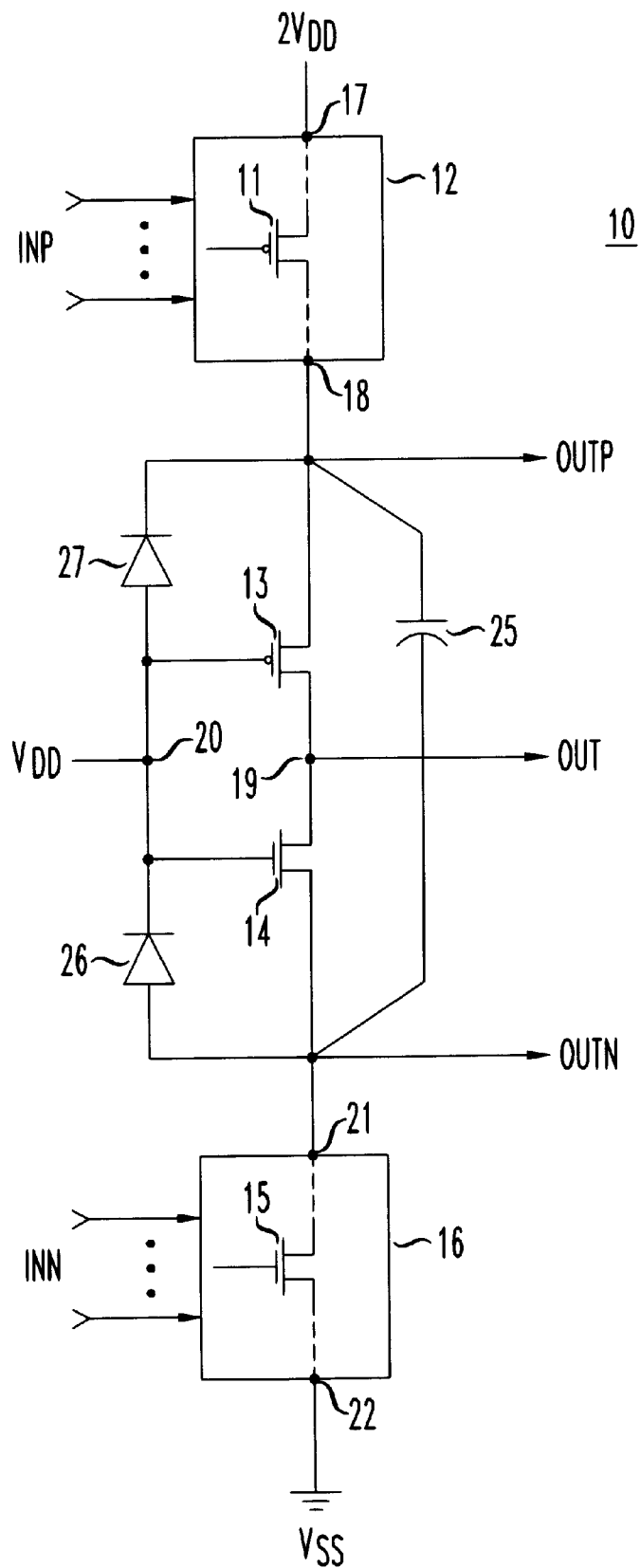
FIG. 1 is an exemplary circuit diagram of a logic circuit according to one embodiment of the invention.

Generally, the invention may be understood by referring to FIG. 1. As discussed below in more detail and in accordance with one embodiment of the invention, a logic gate 10 is shown having an exemplary first transistor 11 in logic block 12, second and third transistors 13, 14, respectively, and an exemplary fourth transistor 15 in logic block 16.

The exemplary first transistor 11 is P-conductivity type transistor and has the outputs (source, drain) thereof coupling between a first power supply terminal 17 (here connected to an exemplary voltage source of twice $V_{DD}$, or 2 $V_{DD}$, although other voltage ratios may be used) and a first node 18.

The second transistor is also a P-conductivity type transistor and has the outputs thereof coupling between the first node 18 and a second node 19. The input (gate) of transistor 13 is connected to a second power supply terminal 20 (here connected to an exemplary voltage source of $V_{DD}$).

The third transistor 14 is of a N-conductivity type and has the outputs thereof coupling between the second node 19 and a third node 21. The input (gate) of transistor 14 also connects to the second supply terminal 20.

The fourth transistor 15 is of the N-conductivity type and has outputs coupling between the third node 21 and a third power supply terminal 22 (here connected to ground or $V_{SS}$, zero volts).

The exemplary first transistor 11 and fourth transistors 15 in blocks 12 and 16 provide in combination the desired logic function, such as NOT, NOR, NAND, etc. The gates of the transistor(s) 11 couple to logic gate inputs INP and the gates of transistor(s) 15 couple to logic inputs INN.

Node 18 connects to output OUTP and node 21 connects to output OUTN. Multiple logic gate designs have inputs INP connected to outputs OUTP and inputs INN connect to outputs OUTN, as will be described below. Interfacing with conventional CMOS logic gates can use just the INN inputs and OUTN output.

Typically, the voltage $V_{DD}$ is less than gate oxide puncture voltage of the transistors and is small enough to avoid substantially increasing the time-dependent breakdown of the gate oxide. (For purposes here, both the gate oxide puncture voltage and the time-dependent gate oxide breakdown voltage are referred to herein as the gate oxide breakdown voltage.) Thus, 2 V DD may be greater than the gate breakdown voltage, such that the voltage on the second node 19 swings substantially from ground to the 2 $V_{DD}$.

Figure 2:
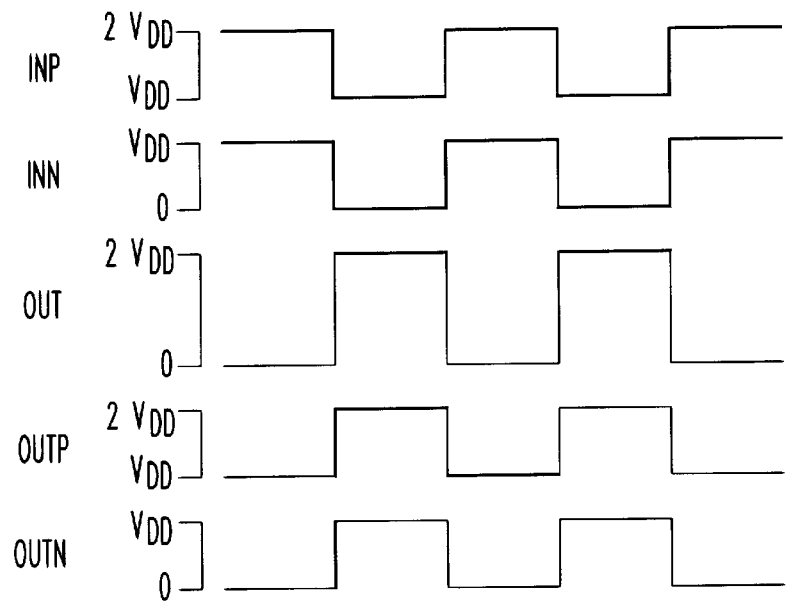
FIG. 2 shows exemplary waveforms from the logic circuit of FIG. 1.

Operation of the gate 10 may be understood by referring to FIG. 2 in combination with FIG. 1. For purposes here, the logic gate 10 performs a NOT function, with one transistor 11 and one transistor 15 as shown, the gates of these transistors connecting to inputs INP, INN, respectively. When the voltage of input INP is substantially $V_{DD}$ and the voltage of input INN is substantially zero volts, the outputs OUT and OUTP are substantially 2 $V_{DD}$ and output OUTN is substantially $V_{DD}$. Conversely, if input INP is substantially 2 $V_{DD}$ and input INN is substantially $V_{DD}$, then outputs OUT and OUTN are both at substantially zero volts and OUTP is substantially $V_{DD}$. Thus, with either input, the maximum voltage across any transistor 11, 13–15 does not exceed $V_{DD}$. If $V_{DD}$ is less than the breakdown voltage of the transistors, then the transistors will not be damaged even though 2 $V_{DD}$ is greater than the breakdown voltage and the output OUT switches substantially the full voltage range of zero to 2 $V_{DD}$.

As shown in FIG. 2, the output signals OUTN and OUTP have substantially the same phase. Thus, to decrease the propagation delay of the logic gate 10, an optional speed-up capacitor 25 is provided that bypasses the transistors 13, 14.

Optional diodes 26, 27 act as clamps to keep output nodes OUTN, OUTP from substantially exceeding their respective desired voltage ranges which may cause the gate oxide voltages of corresponding transistors in logic blocks 12, 16 to break down. For example, diode 26 keeps output node OUTN from substantially going above $V_{DD}$ and diode 27 keeps output node OUTP from substantially going below $V_{DD}$. Possible exemplary mechanisms for causing the output nodes to exceed the desired range include leakage currents through turned off transistors or voltage spikes coupled to the nodes by parasitic capacitances.

Figure 3A:
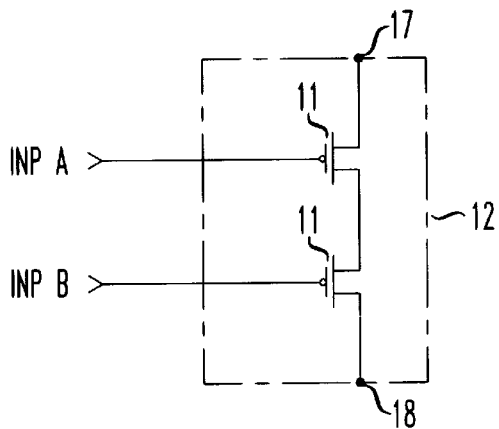
FIGS. 3A, 3B, and FIGS. 4A, 4B are exemplary circuits for inclusion in the logic circuit of FIG. 1 to provide NOR and NAND logic functions, respectively.
Figure 3B:
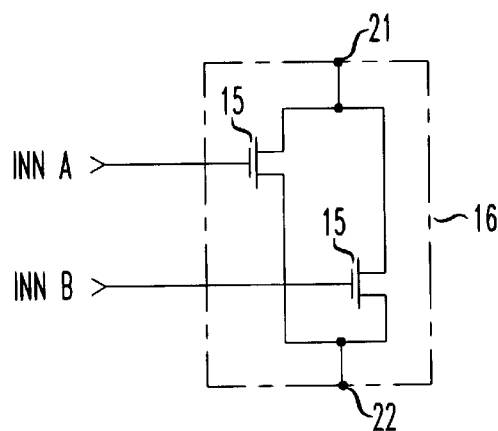
Figure 4A:
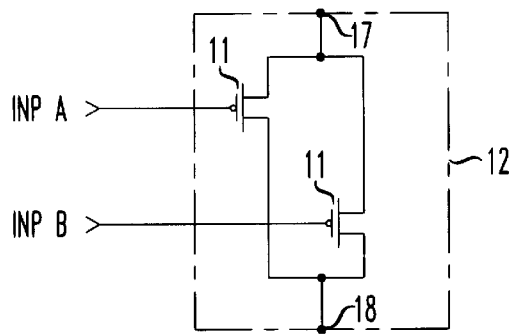
Figure 4B:
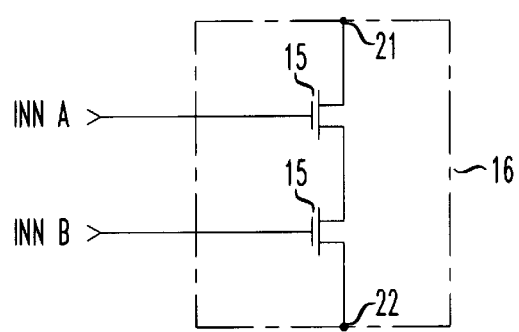

An exemplary implementation of the logic gate 10 with different logic functions is shown in FIGS. 3A, 3B, 4A, and 4B. In FIGS. 3A and 3B, transistors 11, 15 are shown to enable logic gate 10 (FIG. 1) to provide a NOR logic function. Similarly, FIGS. 4A and 4B have transistors 11, 15 configured to enable logic gate 10 to provide a NAND logic function.

Figure 5:
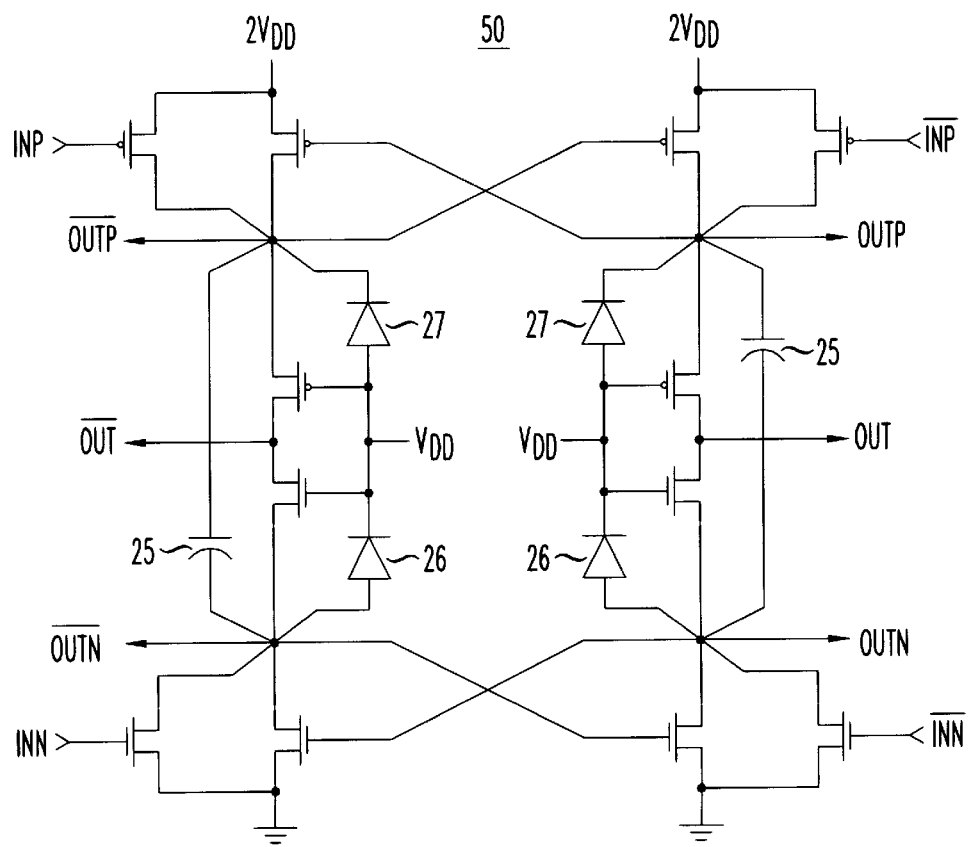
FIG. 5 is an exemplary latch or logic voltage translator circuit according to another embodiment of the invention.

In FIG. 5, the logic gates 10 of FIG. 1 are cross-coupled to provide a latching function and provides complementary output signals. Note that it may be sufficient for signals applied to inputs INN, $\overline{\text{INN}}$ alone (or INP, $\overline{\text{INP}}$ alone) are sufficient to set and reset the latch 50. Thus, the latch 50 can be used as a logic voltage translator to go between the relatively low voltage logic signals (e.g., conventional CMOS) and the translated voltage signals that are utilized by the logic gates 10 (e.g., those on outputs OUTN, $\overline{\text{OUTN}}$, OUTP, and $\overline{\text{OUTP}}$) and vice versa, or to other high voltage logic that can utilize the 2 $V_{DD}$ voltage swing available from outputs OUT, $\overline{\text{OUT}}$. Optional speed up capacitors 25 may be added, as well as clamping diodes 26, 27.

While the devices and circuits shown are exemplary, other topologies may be used to achieve the same results. For example, while FETs are shown, bipolar transistors may be substituted to the extent such substitutions can be done. Further, voltage and current polarities can be reversed with the appropriate change in polarity for the active devices.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

The invention claimed is:

1. In an integrated circuit, a first logic gate having a first logic function comprising:
   at least one first transistor of a first conductivity type, having two outputs and an input, the outputs thereof coupling between a first power supply terminal and a first node;
   a second transistor of the first conductivity type, having two outputs and an input, the outputs coupling between the first node and a second node, and the input coupling to a second power supply terminal;
   a third transistor of a second conductivity type, having two outputs and an input, the outputs thereof coupling between the second node and a third node, the input coupling to the second supply terminal;
   at least one fourth transistor of the second conductivity type, having two outputs and an input, the outputs thereof coupling between a third node and a third power supply terminal; and
   a capacitor coupling between the first and third nodes;
   wherein the at least one first transistor and at least one fourth transistor provide in combination the first logic function.

2. The integrated circuit as recited in claim 1, wherein the voltage to be applied to the second power supply terminal is between the voltages to be applied to the first and third power supply terminals.

3. The integrated circuit as recited in claim 1, wherein the inputs of the first and fourth transistors are inputs of the logic gate.

4. The integrated circuit as recited in claim 3, wherein the first, second, and third nodes are outputs of the first logic gate, the voltage of the first node capable of being between the voltage of the first power supply terminal and the voltage of the second power supply terminal, the voltage of the second node is capable of a voltage between the voltage of the first power supply terminal and the voltage of the third power supply, and the voltage of the third node capable of being between the voltage of the second power supply terminal and the voltage of the third power supply terminal.

5. The integrated circuit as recited in claim 4, further comprising a second logic gate having a second logic function comprising:
   at least one first transistor of a first conductivity type, having two outputs and an input, the outputs thereof coupling between the first power supply terminal and a fourth node;
   a second transistor of the first conductivity type, having two outputs and an input, the outputs coupling between the fourth node and a fifth node, and the input coupling to the second power supply terminal;
   a third transistor of a second conductivity type, having two outputs and an input, the outputs thereof coupling between the fifth node and a sixth node, the input coupling to the second supply terminal;
   at least one fourth transistor of the second conductivity type, having two outputs and an input, the outputs thereof coupling between the sixth node and the third power supply terminal;
   wherein the at least one first transistor and at least one fourth transistor provide in combination the second logic function; and
   wherein the first and third nodes of the first logic gate connect to corresponding inputs of the at least one first and fourth transistors of the second logic gate.

6. The integrated circuit as recited in claim 3, wherein a plurality of first and fourth transistors in combination provide a NAND function.

7. The integrated circuit as recited in claim 3, wherein a plurality of first and fourth transistors in combination provide a NOR function.

8. The integrated circuit as recited in claim 1, further comprising a second logic gate connected to the first logic gate forming a latch circuit, the second logic gate comprising:

at least one first transistor of a first conductivity type, having two outputs and an input, the output thereof coupling between the first power supply terminal and a first node;

a second transistor of the first conductivity type, having two outputs and an input, the outputs coupling between the first node and a second node, and the input coupling to the second power supply terminal;

a third transistor of a second conductivity type, having two outputs and an input, the outputs thereof coupling between the second node and a third node, the input coupling to the second supply terminal;

at least one fourth transistor of the second conductivity type, having two outputs and an input, the output thereof coupling between a third node and a third power supply terminal; and wherein the input of the at least one first transistor of the first logic gate is connected to the first node of the second logic gate, the input of the at least one first transistor of the second logic gate is connected to the first node of the first logic gate, the input of the at least one fourth transistor of the first logic gate is connected to the third node of the second logic gate, and the input of the at least one fourth transistor of the second logic gate is connected to the third node of the first logic gate.

9. The integrated circuit as recited in claim 1, wherein each of the transistors has a minimum gate breakdown voltage, the third power supply terminal is coupled to ground, the first power supply terminal is adapted to be coupled to a voltage source with a voltage greater than the gate breakdown voltage, and the second power supply terminal is adapted to couple to a voltage source with a voltage less than the gate breakdown voltage.

10. The integrated circuit as recited in claim 9, wherein the transistors of the first type are P-channel transistors and the transistors of the second type are N-channel transistors.

11. The integrated circuit as recited in claim 1, further comprising first and second clamping diodes, connected between the second power supply terminal and the first and third nodes, respectively.

12. A logic voltage translator circuit, comprising:

a first pair of cross-coupled first conductivity type transistors, each transistor having an output coupling to a first power supply terminal and respective outputs coupling to first and second output nodes;

a second pair of cross-coupled second conductivity type transistors, each transistor having an output coupling to a second power supply terminal and respective outputs coupling to third and fourth output nodes;

a first pair of transistors, each of a different conductivity type and with outputs disposed in series between the first and third output nodes and inputs coupling to a third power supply terminal;

a second pair of transistors, each of a different conductivity type and with outputs disposed in series between the second and fourth output nodes and inputs coupling to the third power supply terminal; and first and second transistors, in combination with respective first pair of transistors, having inputs thereof adapted to receive logic input signals.

13. The logic circuit as recited in claim 12, wherein the voltage to be applied to the third power supply terminal is between the voltages to be applied to the first and second power supply terminals.

14. The logic circuit as recited in claim 12, wherein each of the transistors has a minimum gate breakdown voltage, the second power supply terminal is coupled to ground, the first power supply terminal is adapted to be coupled to a voltage source with a voltage greater than the gate breakdown voltage, and the third power supply terminal is adapted to couple to a voltage source with a voltage less than the gate breakdown voltage.

15. The logic circuit as recited in claim 14, wherein the transistors of the first type are P-channel transistors and the transistors of the second type are N-channel transistors.

16. The logic circuit as recited in claim 12, wherein each of the transistors has a minimum gate breakdown voltage, the first power supply terminal is coupled to ground, the second power supply terminal is adapted to be coupled to a voltage source with a voltage greater than the gate breakdown voltage, and the third power supply terminal is adapted to couple to a voltage source with a voltage less than the gate breakdown voltage.

17. The logic circuit as recited in claim 16, wherein the transistors of the first type are N-channel transistors and the transistors of the second type are P-channel transistors.

18. The logic circuit as recited in claim 12, further comprising:

first and second clamping diodes connected between the third power supply terminal and the first and third nodes, respectively; and third and fourth clamping diodes connected between the third power supply terminal and the second and fourth nodes, respectively.

19. The logic circuit as recited in claim 12, further comprising a first capacitor connected between the first and third nodes, and a second capacitor connected between the second and fourth nodes.

20. The logic circuit as recited in claim 12, wherein the logic gate is formed in an integrated circuit.

* * * * *